(12) United States Patent
Park et al.

(10) Patent No.: US 8,436,342 B2
(45) Date of Patent: May 7, 2013

(54) ORGANIC LIGHT EMITTING DISPLAY DEVICE AND METHOD OF MANUFACTURING THE SAME

(75) Inventors: Jin-Seong Park, Yongin (KR); Yeon-Gon Mo, Yongin (KR); Jae-Kyeong Jeong, Yongin (KR); Min-Kyu Kim, Yongin (KR); Hyun-Joong Chung, Yongin (KR); Tae-Kyung Ahn, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 340 days.

(21) Appl. No.: 12/654,938

(22) Filed: Jan. 8, 2010

(65) Prior Publication Data
US 2010/0176383 A1 Jul. 15, 2010

(30) Foreign Application Priority Data

Jan. 12, 2009 (KR) .................. 10-2009-0002242

(51) Int. Cl.
*H01L 51/52* (2006.01)
*H01L 51/56* (2006.01)
*H01L 33/00* (2010.01)

(52) U.S. Cl.
USPC .......... 257/40; 438/23; 438/46; 257/E51.018; 257/E33.053

(58) Field of Classification Search ............ 257/40, 257/E51.018, E33.053; 438/23, 46
See application file for complete search history.

(56) References Cited

U.S. PATENT DOCUMENTS

| 7,319,044 B2 | 1/2008 | Han et al. |
| 2004/0257353 A1 | 12/2004 | Imamura et al. |
| 2007/0120785 A1* | 5/2007 | Kimura ................ 345/82 |

(Continued)

FOREIGN PATENT DOCUMENTS

| JP | 2006-165529 A | 6/2006 |
| JP | 2010171404 | 8/2010 |

(Continued)

OTHER PUBLICATIONS

Korean Office Action dated Aug. 31, 2010 for the corresponding Korean Priority Application No. 10-2009-0002242 and a Request for Entry of the Accompanying Office Action herewith.

(Continued)

*Primary Examiner* — Calvin Lee
*Assistant Examiner* — Monica D Harrison
(74) *Attorney, Agent, or Firm* — Robert E. Bushnell, Esq.

(57) ABSTRACT

Disclosed is an organic light emitting display device and a method of manufacturing the same. The organic light emitting display device includes the thin film transistor of the drive unit that has the activation layer formed in a structure where the first oxide semiconductor layer and the second oxide semiconductor layer are stacked, the thin film transistor of the pixel unit that has the activation layer formed of the second oxide semiconductor layer, and the organic light emitting diode coupled to the thin film transistor of the pixel unit. The thin film transistor of the drive unit has channel formed on the first oxide semiconductor layer having a higher carrier concentration than the second oxide semiconductor layer, having a high charge mobility, and the thin film transistor of the pixel unit has a channel formed on the second oxide semiconductor layer, having a stable and uniform functional property.

20 Claims, 7 Drawing Sheets
(3 of 7 Drawing Sheet(s) Filed in Color)

U.S. PATENT DOCUMENTS

| | | | |
|---|---|---|---|
| 2009/0002591 | A1 | 1/2009 | Yamazaki et al. |
| 2009/0179199 | A1 | 7/2009 | Sano et al. |
| 2010/0163868 | A1 | 7/2010 | Yamazaki et al. |

FOREIGN PATENT DOCUMENTS

| | | |
|---|---|---|
| KR | 10-2006-0001711 | 1/2006 |
| KR | 10-2006-0114459 | 11/2006 |
| KR | 10-2007-0012609 | 1/2007 |
| KR | 1020070057042 A | 6/2007 |
| WO | 2008/126878 A1 | 10/2008 |
| WO | 2008126878 A1 | 10/2008 |

OTHER PUBLICATIONS

Chinese Office Action issued by Chinese Patent Office on Jun. 9, 2011, corresponding to Chinese Patent Application No. 201010002358.X, which claims as its priority Korean Priority Application No. 10-2009-0002242, and Request for Entry of the Accompanying Office Action attached herewith.

Extended European search report is dated Jun. 7, 2010 of the European Patent Application No. 10150419.9, which claims priority of the corresponding Korean priority application No. 10-2009-0002242.

Shim J. H. et al.: "Electrical characterization and microstructural observation of IGZO-TFT fabricated by sol-gel method" 216. Meeting of the Electrochemical Society, vol. MA2009-02, Oct. 7, 2009, p. 1938, XP002581802 * figure 1 *.

Korean Office Action issued by KIPO, dated Apr. 5, 2011, corresponding to Korean Patent Application No. 10-2009-0002242, together with Request for Entry.

Chinese Patent Gazette issued on Nov. 28, 2012 of Chinese Patent Application No. 201010002358.X, which claims priority of the corresponding Korean Priority Application No. 10-2009-0002242. With translation of Certificate of Invention Patent.

Japanese Office Action issued on Aug. 7, 2012 by JPO in connection with Japanese Patent Application Serial No. 2009-070440, which also claims Korean Patent Application Serial No. 10-2009-0002242 and Request for Entry of the Accompanying Office Action attached herewith.

* cited by examiner

ORGANIC LIGHT EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 12 Jan. 2009 and there duly assigned Serial No. 10-2009-0002242.

BACKGROUND OF THE INVENTION

1. Field of the Invention

The present invention relates to an organic light emitting display device and a method of manufacturing the same, and more particularly, to an organic light emitting display device that has a difference in charge mobility between a thin film transistor of a drive unit and a thin film transistor of a pixel unit, and a method of manufacturing the same.

2. Discussion of Related Art

An organic light emitting display device is a next generation display device which may actively emit light. Compared to a liquid crystal display device (LCD), the organic light emitting display device has excellent characteristics in view of view angle, contrast, response speed, power consumption, and other related functional properties.

An organic light emitting display device generally includes an organic light emitting diode that has an anode electrode, an organic light emitting layer, and a cathode electrode. The organic light emitting display device may be divided into a passive matrix type where the organic light emitting diode is connected between scan lines and signal lines in a matrix type to constitute a pixel, and an active matrix type where the operations of each pixel are controlled by a thin film transistor (TFT) that functions as a switch.

In the thin film transistor used in the active matrix type of organic light emitting display device, an activation layer provides source and drain regions, and a channel region. The activation layer is generally formed of a semiconductor layer made of amorphous silicon, poly-silicon, low temperature poly-silicon (LTPS), or other similar material.

In general, the amorphous silicon has a low mobility, therefore, the amorphous silicon is difficult to be implemented in a driving circuit which operates at a high speed. Therefore, the activation layer is generally made of the poly-silicon or the low temperature poly-silicon that has a high charge mobility compared to the amorphous silicon. However, the poly-silicon has a disadvantage that threshold voltage is uneven due to the nature of polycrystalline, and the low temperature poly-silicon has a disadvantage that a laser annealing or other related process for crystallization may be required during the manufacture of the poly-silicon.

Research and study on the oxide semiconductor which may be used as an activation layer have been recently conducted in order to solve the above identified problems.

Japanese Laid-Open Patent Publication No. 2004-273614 discloses a thin film transistor which has zinc oxide (ZnO) or an oxide semiconductor having zinc oxide (ZnO) as a main ingredient, as an activation layer.

An amorphous InGaZnO (Indium-Gallium-Zinc oxide; hereinafter, referred to as IGZO) has charge mobility higher by ten times (about 10 $cm^2$/V·sec) compared to the amorphous silicon, and has even property distribution, therefore, the amorphous IGZO is sufficient for being used as the activation layer of the thin film transistor of the pixel unit. The amorphous IGZO is however insufficient for being used as the activation layer of the thin film transistor of the drive unit where a high charge mobility (about 100 $cm^2$/V·sec) at a level of the low temperature poly-silicon is required. Furthermore, since the size and the requirement of the resolution of a display device are increased, the amount of data transmitted and the processing speed should be increased, and the most part of a driving circuit should be formed on one substrate in order to reduce the cost of manufacture. Therefore, significant problems may occur in stable property distribution and reliability of the thin film transistor of the drive unit.

SUMMARY OF THE INVENTION

It is therefore an object of the present invention to provide an improved organic light emitting display device that can improve charge mobility of a thin film transistor which uses an oxide semiconductor as an activation layer, and a method of manufacturing the same.

It is another object of the present invention to provide an organic light emitting display device in which the charge mobility of a thin film transistor of a drive unit is higher than the charge mobility of a thin film transistor of a pixel unit, and a method of manufacturing the same.

In order to accomplish the above objects, according to one aspect of the present invention, there is provided an organic light emitting display device including: a substrate that includes a first region and a second region; a first thin film transistor that includes a gate electrode formed in the first region on the substrate, an activation layer insulated from the gate electrode by a gate insulating layer and the activation layer formed in a structure where a first semiconductor layer and a second semiconductor layer are stacked, and source and drain electrodes electrically and physically coupled to the activation layer, with the first oxide semiconductor layer having a carrier concentration higher than the second oxide semiconductor layer; a second thin film transistor that includes a gate electrode formed in the second region on the substrate, an activation layer insulated from the gate electrode by a gate insulating layer and formed of the second oxide semiconductor layer, and source and drain electrodes electrically and physically coupled to the activation layer; an insulating layer that is formed on the second thin film transistor and has a via hole in order that the source or drain electrode of the second thin film transistor is exposed; and an organic light emitting diode that includes a first electrode formed on the insulating layer in the second region and the first electrode electrically and physically coupled to the source or drain electrode of the second thin film transistor through the via hole, an organic light emitting layer formed on the first electrode; and a second electrode formed on the organic light emitting layer.

According to another aspect of the present invention, there is provided a method of manufacturing an organic light emitting display device, including steps of: preparing a substrate that includes a first region and a second region; forming gate electrodes of first and second thin film transistors respectively disposed in the first and second regions on the substrate; forming a gate insulating layer on the gate electrodes in the first and second regions; forming an activation layer formed in a structure where a first semiconductor layer and a second semiconductor layer are stacked on the gate insulating layer in the first region, the first oxide semiconductor layer having a carrier concentration higher than the second oxide semiconductor layer, and forming an activation layer formed of the second oxide semiconductor layer on the gate insulating layer in the second region; forming source and drain electrodes to be electrically and physically coupled to the activation layer in the first and second regions, respectively; forming an insulating layer on the second thin film transistor and then forming a via hole in order that the source or drain electrode of the second thin film transistor is exposed; and forming an organic light emitting diode that includes a first electrode formed on the insulating layer in the second region and the first electrode electrically coupled to the source or drain electrode of the second thin film transistor through the via hole, an organic light emitting layer formed on the first electrode; and a second electrode formed on the organic light emitting layer.

The organic light emitting display device according to the present invention includes the thin film transistor of the drive unit that has the activation layer formed in a structure where the first oxide semiconductor layer and the second oxide semiconductor layer are stacked, the thin film transistor of the pixel unit that has the activation layer formed of the second oxide semiconductor layer, and the organic light emitting diode physically coupled to the thin film transistor of the pixel unit. The thin film transistor of the drive unit has a channel formed on the first oxide semiconductor layer having a higher carrier concentration than the second oxide semiconductor layer, having a high charge mobility. The thin film transistor of the pixel unit has a channel formed on the second oxide semiconductor layer, so that the thin film transistor of the pixel unit has a stable and uniform functional property.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

More complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Accordingly, the drawings and description are to be regarded as illustrative in nature and not restrictive.

In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Further, some of the elements that are not essential to the complete description of the invention have been omitted for clarity. In addition, like reference numerals refer to like elements throughout.

Hereinafter, exemplary embodiments according to the present invention will be described in detail with reference to the accompanying drawings.

Figure 1A:
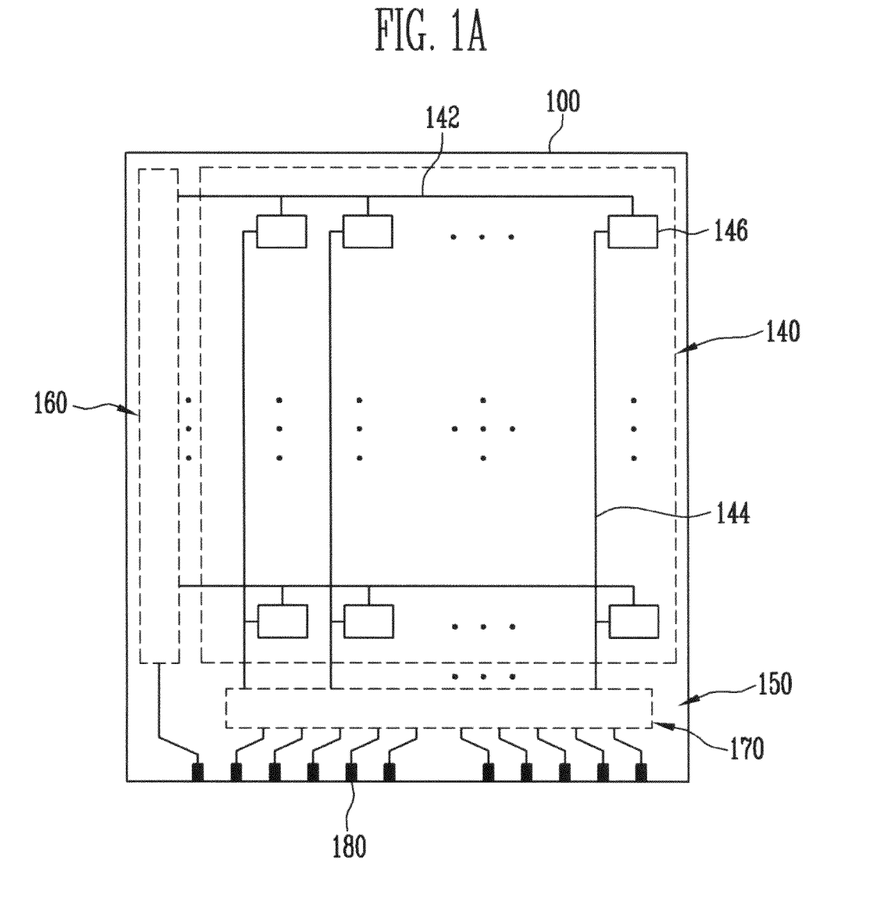
FIGS. 1A and 1B are respectively a plan view and a cross-sectional view explaining an organic light emitting display device in accordance with the present invention.
Figure 1B:
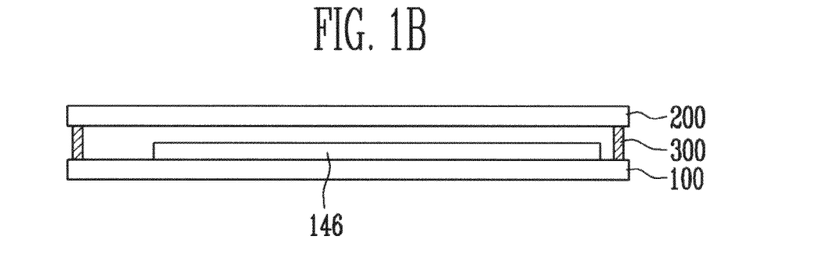

FIGS. 1A and 1B are respectively a plan view and a cross-sectional view explaining an organic light emitting display device in accordance with the present invention.

Referring to FIG. 1A, a substrate 100 includes a pixel region 140 and a non-pixel region 150. Non-pixel region 150 becomes a region surrounding pixel region 140 or a region other than pixel region 140.

Scan lines 142 and data lines 144 are formed in pixel region 140 disposed on substrate 100, and are intersected with each other. In pixel region 140 disposed on substrate 100, a plurality of pixel units 146 are disposed and coupled between scan lines 142 and data lines 144 in a matrix type. Pixel unit 146 may include an organic light emitting diode, a thin film transistor that controls the operation of the organic light emitting diode, and a capacitor that maintains signals.

Scan lines 142 and data lines 144 are extended from pixel region 140 to non-pixel region 150. In non-pixel region 150 disposed on substrate 100, a power supply line (not shown) operates the organic light emitting diode, and a scan drive unit 160 and a data drive unit 170 process signals provided from the exterior through a pad 180 in order to supply the external signals to scan lines 142 and data lines 144. Scan drive unit 160 and data drive unit 170 include a driving circuit that converts the external signals through pad 180 into the scan signals and data signals in order to selectively drive each of the pixels.

Referring to FIG. 1B, on substrate 100 where pixel unit 146 is formed, a sealing substrate 200 that seals pixel region 140 is disposed, and sealing substrate 200 is bonded to substrate 100 by means of a sealant 300 that is disposed to surround pixel region 140.

Figure 2:
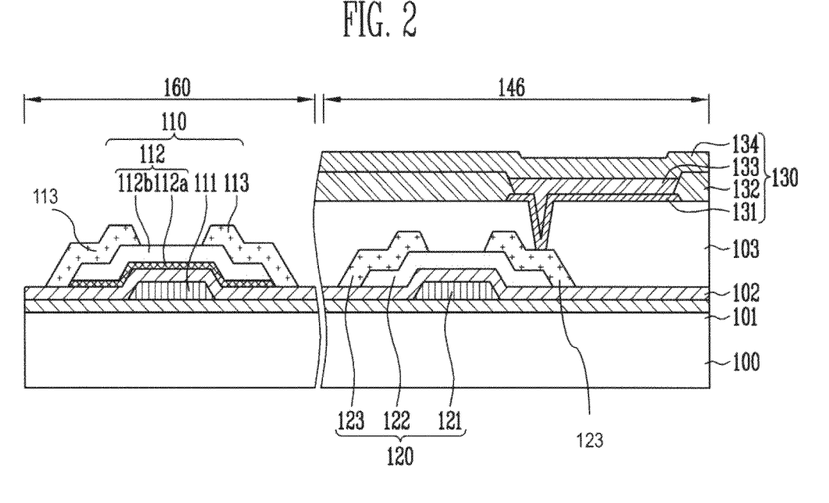
FIG. 2 is a cross-sectional view explaining the structures of a pixel unit and a scan drive unit of FIG. 1A.

FIG. 2 is a cross-sectional view more specifically explaining the structures of pixel unit 146 and scan drive unit 160 of FIG. 1A. For convenience of explanation, pixel unit 146 shows only a thin film transistor 120 and an organic light emitting diode 130, and scan drive unit 160 shows only a thin film transistor 110. In the drawing, only scan drive unit 160 is shown, however a thin film transistor of a data drive unit 170 has the same structure.

Referring to FIG. 2, a buffer layer 101 is formed on substrate 100 in both of pixel region 140 and non-pixel region 150. In the drawing, pixel region 140 shows pixel unit 146, and non-pixel region 150 shows scan drive unit 160.

Thin film transistor 110 that forms the driving circuit is formed on buffer layer 101 of scan drive unit 160, and a thin film transistor 120 that functions as a switch is formed on buffer layer 101 of pixel unit 146.

Thin film transistor 110 of scan drive unit 160 includes a gate electrode 111, an activation layer 112 insulated from gate electrode 111 by a gate insulating layer 102, and source and drain electrodes 113 electrically and physically coupled to activation layer 112 in source and drain regions. Activation layer 112 is formed in a structure where semiconductor layers having different carrier concentrations (different conductivities) are stacked, more specifically, in a structure where a first oxide semiconductor layer 112a having a high carrier concentration and a second oxide semiconductor layer 112b having a carrier concentration lower than that of the first oxide semiconductor layer 112a are stacked. In other words, a thickness of a portion where a channel is substantially formed (for example, a thickness of about 1 nm to 5 nm) is formed of the first oxide semiconductor layer 112a having a relatively higher carrier concentration (1e+19 to 1e+21#/cm$^3$) (herein # represents the number of carriers), and a thickness of most portions other than the portion where a channel is substantially formed (for example, a thickness of about 10 to 50 nm) is formed of the second oxide semiconductor layer 112b having a relatively lower carrier concentration (1e+13 to 1e+18#/cm$^3$). For example, the first oxide semiconductor layer 112a may be selected from a group consisting of Indium-tin oxide (ITO), InZnO (IZO), InSnO, AlZnO, AlGaO and InGaO, and the second oxide semiconductor layer 112b may be formed of zinc oxide (ZnO) or zinc oxide (ZnO) doped with one ion selected from gallium (Ga), indium (In), stannum (Sn), zirconium (Zr), hafnium (Hf), cadmium (Cd), silver (Ag), copper (Cu), germanium (Ge), gadolinium (Gd), and vanadium (V), for example, ZnO, ZnSnO, and InGaZnO, etc., ITO and IZO, etc., are commonly used as a conductive layer, however, these materials may have semiconductor properties when the carrier concentration thereof is controlled by controlling the thickness to be thin and controlling the oxygen concentration during the deposition process.

Meanwhile, thin film transistor 120 of pixel unit 146 includes gate electrode 121, activation layer 122 insulated from gate electrode 121 by gate insulating layer 102, and source and drain electrodes 123 electrically and physically coupled to activation layer 122 in the source and drain regions, wherein activation layer 122 is formed of an oxide semiconductor having the same layer or the same material as the second oxide semiconductor layer 112b that constitutes activation layer 112 of thin film transistor 110. In other words, activation layer 122 may be formed of zinc oxide (ZnO) or zinc oxide (ZnO) doped with one ion selected from gallium (Ga), indium (In), stannum (Sn), zirconium (Zr), hafnium (Hf), cadmium (Cd), silver (Ag), copper (Cu), germanium (Ge), gadolinium (Gd), and vanadium (V), for example, ZnO, ZnSnO, and InGaZnO, etc.

Also, an insulating layer 103 is formed for planarization on thin film transistor 120 of pixel unit 146, and a via hole is formed on insulating layer 103 in order that source or drain electrodes 123 of thin film transistor 120 are exposed. An organic light emitting diode 130 is formed on insulating layer 103 of pixel unit 146 to be electrically coupled to one of source and drain electrodes 123 of thin film transistor 120 through the via hole.

Organic light emitting diode 130 includes an anode electrode 131 that is electrically coupled to one of source and drain electrodes 123 of thin film transistor 120 through the via hole, an organic light emitting layer 133 formed on anode electrode 131 in a light emitting region exposed by a pixel definition layer 132, and a cathode electrode 134 formed on pixel definition layer 132 that includes organic light emitting layer 133. Organic light emitting layer 133 may include a hole injection layer, a hole transport layer, an electron transport layer, and an electron injection layer.

With the present invention constituted as above, activation layer 122 of thin film transistor 120 of pixel unit 146 is formed of the oxide semiconductor layer identified above, and activation layer 112 of thin film transistor 110 of drive units 160 and 170 is formed in a structure where the first oxide semiconductor layer 112a and the second oxide semiconductor layer 112b, having different carrier concentrations (i.e., having different conductivities), are stacked. In other words, activation layer 122 of thin film transistor 120 of pixel unit 146 where relatively low charge mobility (10 to 20 cm$^2$/V·sec) and high property uniformity are required, is formed of the oxide semiconductor layer made of ZnO, InGaZnO, InSnZnO and ZnSnO, etc.; and activation layer 112 of thin film transistor 110 of drive units 160 and 170, where a relatively high charge mobility (50 to 130 cm$^2$/V·sec) is required, is formed of the first oxide semiconductor layer 112a made of ITO and IZO, etc. having a relatively higher carrier concentration (having a high concentration), and the second oxide semiconductor layer 112b made of ZnO, InGaZnO, InSnZnO and ZnSnO, etc. having a lower carrier concentration (having a low concentration). Therefore, thin film transistor 110 of drive units 160 and 170 has a channel formed on the first oxide semiconductor layer 112a having a higher carrier concentration than that of the second oxide semiconductor layer 112b so that thin film transistor 110 has a high charge mobility; and thin film transistor 120 of pixel unit 146 has a channel formed on the second oxide semiconductor layer 122 so that thin film transistor 120 has a stable and even property.

Figure 3A:
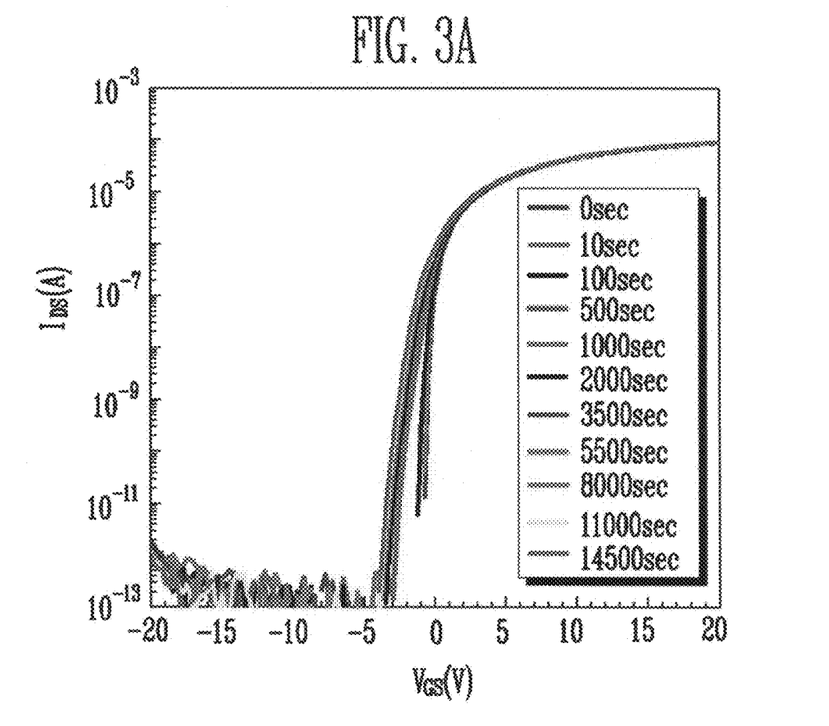
FIGS. 3A through 3C are color images that show two dimensional graphs showing the change of current $I_{DS}$ between a drain electrode and a source electrode according to the change of voltage $V_{GS}$ applied to a gate electrode and the source electrode of a thin film transistor as shown in FIG. 2.
Figure 3B:
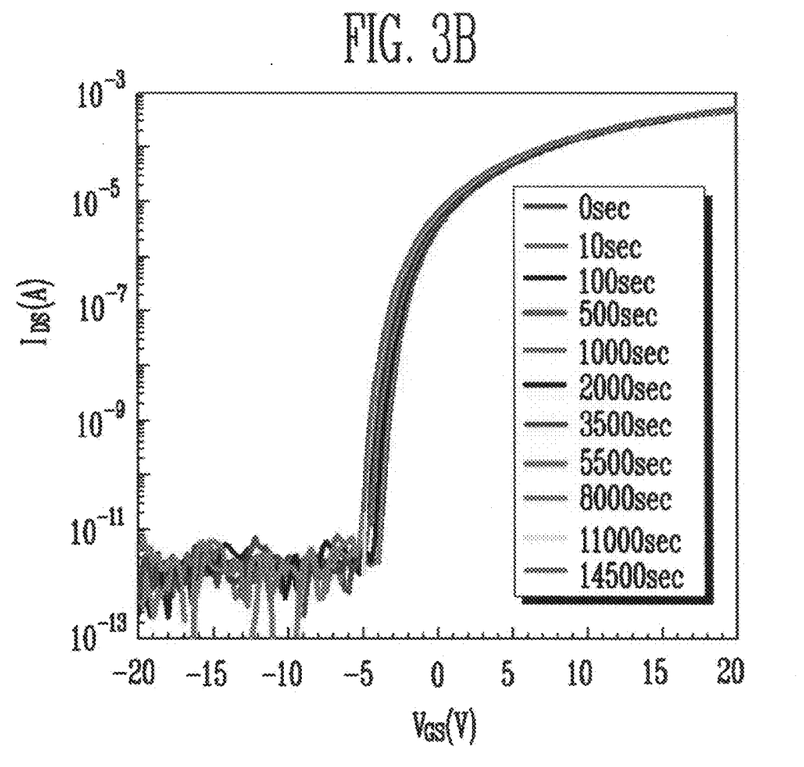
Figure 3C:
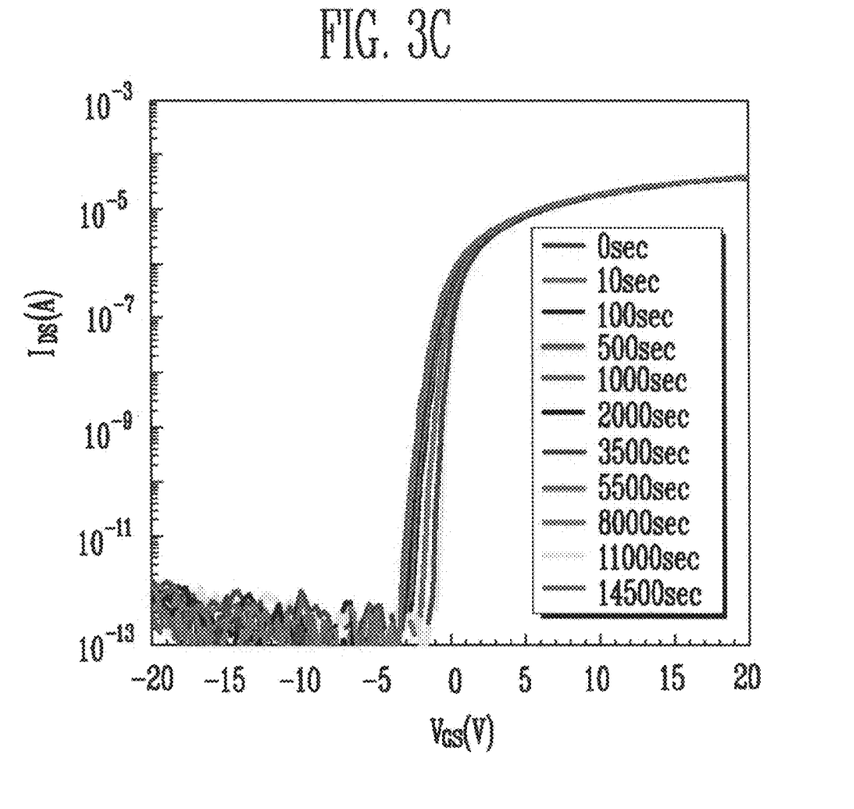

FIGS. 3A through 3C are color images that show two dimensional graphs showing the change in current $I_{DS}$ between the drain electrode and the source electrode according to the change in voltage $V_{GS}$ applied between the gate electrode and the source electrode. Curve of 0 sec shown in FIGS. 3A through 3C means a state that electric stress is not applied. FIG. 3A shows thin film transistor 110 of drive unit 160 that has activation layer 112 made of InZnO 112a and GaInZnO 112b; FIG. 3B shows thin film transistor 110 of drive unit 160 that has activation layer 112 made of ITO 112a and GaInZnO 112b; and FIG. 3C shows thin film transistor 110 of pixel unit 146 that has activation layer 122 made of GaInZnO. Because carrier concentrations and charge mobilities of IZO channel (FIG. 3A) and ITO channel (FIG. 3B) are higher than those of IGZO channel (FIG. 3C), on-current characterization of IZO channel (FIG. 3A) and ITO channel (FIG. 3B) are better than IGZO channel (FIG. 3C). It can be appreciated that when the size of device is the same, the thin film transistor of drive unit 160 of FIGS. 3A and 3B is more excellent on current property compared to thin film transistor 120 of the pixel unit 146 of FIG. 3C, resulted from the difference in charge mobility of the oxide semiconductor layers.

FIGS. 4A through 4D are cross-sectional views showing a method of manufacturing an organic light emitting display device in accordance with the present invention.

Figure 4A:
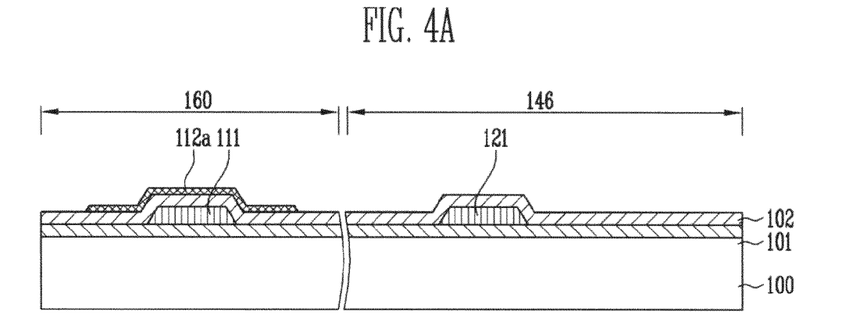
FIGS. 4A through 4D are cross-sectional views showing a method of manufacturing an organic light emitting display device in accordance with the present invention.

Referring to FIG. 4A, a substrate 100 defined with a pixel region 140 and a non-pixel region 150 is prepared. In the drawing, pixel region 140 shows a pixel unit 146, and non-pixel region 150 shows a scan drive unit 160.

A buffer layer 101 is formed on substrate 100 in pixel region 140 and non-pixel region 150, and gate electrodes 111 and 121 of thin film transistors 110 and 120 are formed on the buffer layer of scan driver unit 160 and pixel unit 146, respectively.

Gate insulating layer 102 and the first oxide semiconductor layer 112a are sequentially formed on the entire gate electrodes 111 and 121. Then the first oxide semiconductor layer 112a is patterned, thereby maintaining the first oxide semiconductor layer 112a only disposed on gate insulating layer 102 of scan drive unit 160. The first oxide semiconductor layer 112a is formed by depositing ITO, IZO, InSnO, AlZnO, AlGaO, and InGaO at a thickness of 1 nm to 5 nm.

Figure 4B:
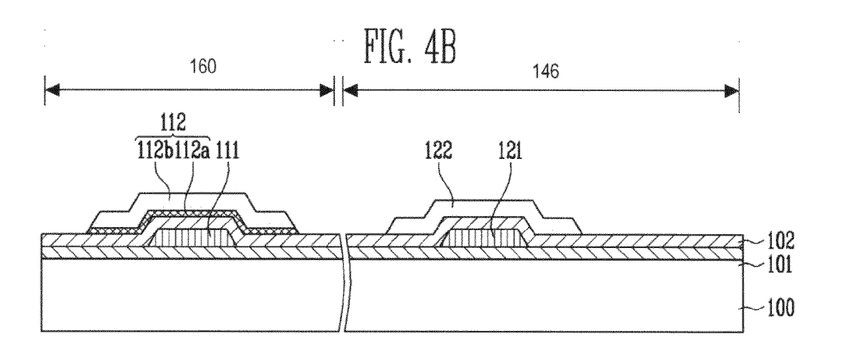

Referring to FIG. 4B, the second oxide semiconductor layer 112b is formed on the entire upper portion in which the first oxide semiconductor layer 112a is included, and then is patterned. Therefore, activation layer 112 is formed in a stacked structure of the first oxide semiconductor layer 112*a* and the second oxide semiconductor layer 112*b* in scan drive unit 160. Simultaneously, activation layer 122 is formed of the same layer as the second oxide semiconductor layer 112*b* in pixel unit 146. The second oxide semiconductor layer 112*b* is made of ZnO, ZnSnO and InGaZnO, etc.

Figure 4C:
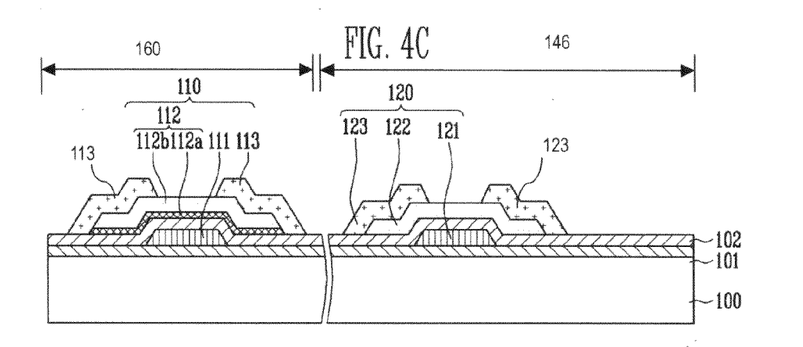

Referring to FIG. 4C, a conductive layer is formed on the entire upper portion in which activation layers 112 and 122 are included and is then patterned, thereby forming source and drain electrodes 113 and 123 electrically coupled to the source and drain regions of activation layers 112 and 122, respectively.

Figure 4D:
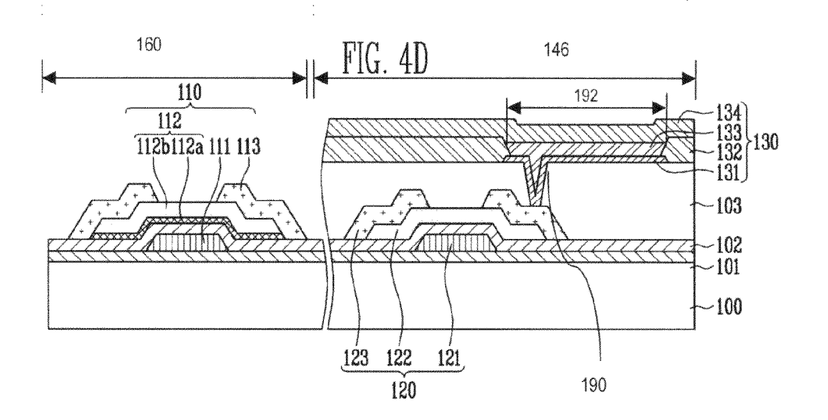

Referring to FIG. 4D, insulating layer 103 is formed in order that the upper portion, in which thin film transistors 110 and 120 are included or the upper portion in which the thin film transistor 120 is included, is planarized. Then via hole 190 is formed in order that one of source and drain electrodes 123 of thin film transistor 120 is exposed. On insulating layer 103 of pixel unit 146, anode electrode 131, that is electrically coupled to one of source and drain electrode 123 of thin film transistor 120 through via hole 190, is formed.

Opening part 192 is formed on anode electrode 131 in order that anode electrode 131 in the light emitting region is exposed by forming and patterning pixel definition layer 132; and organic light emitting layer 133 is formed on the anode electrode of the opening part. Organic light emitting layer 133 may include a hole injection layer, a hole transport layer, an electron transport layer and an electron injection layer.

Thereafter, cathode electrode 134 is formed on pixel definition layer 132 including organic light emitting layer 133, thereby forming organic light emitting diode 130.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an organic light emitting display device, comprising:
    preparing a substrate that includes a first region and a second region;
    forming gate electrodes of first and second thin film transistors respectively in the first and second regions on the substrate;
    forming a gate insulating layer on the gate electrodes formed in the first and second regions;
    forming a first activation layer in a structure where a first semiconductor layer and a second semiconductor layer are stacked on the gate insulating layer in the first region, the first oxide semiconductor layer having a higher carrier concentration compared to that of the second oxide semiconductor layer, and forming a second activation layer formed of the second oxide semiconductor layer on the gate insulating layer in the second region;
    forming source and drain electrodes to be electrically and physically coupled to the first and second activation layers respectively disposed in the first and second regions;
    forming an insulating layer on the second thin film transistor and then forming a via hole in order that one of the source and drain electrodes of the second thin film transistor is exposed; and
    forming an organic light emitting diode that comprises a first electrode formed on the insulating layer in the second region and the first electrode electrically coupled to one of the source and drain electrodes of the second thin film transistor through the via hole, an organic light emitting layer formed on the first electrode, and a second electrode formed on the organic light emitting layer.

2. An organic light emitting display device manufactured by the method of claim 1, wherein the first region is a drive unit.

3. An organic light emitting display device manufactured by the method of claim 1, wherein the first oxide semiconductor layer made of at least one material selected from a group consisting of ITO, InZnO, InSnO, AlZnO, AlGaO and InGaO.

4. An organic light emitting display device manufactured by the method of claim 1, wherein the first oxide semiconductor layer is formed to be thinner than the second oxide semiconductor layer.

5. An organic light emitting display device manufactured by the method of claim 4, wherein the first oxide semiconductor layer is formed with a thickness of 1 to 5 nm.

6. An organic light emitting display device manufactured by the method of claim 1, wherein the second oxide semiconductor layer comprises zinc oxide (ZnO).

7. An organic light emitting display device manufactured by the method of claim 6, wherein the second oxide semiconductor layer is doped with at least one ion selected from gallium (Ga), indium (In), stannum (Sn), zirconium (Zr), hafnium (Hf), cadmium (Cd), silver (Ag), copper (Cu), germanium (Ge), gadolinium (Gd), and vanadium (V).

8. An organic light emitting display device manufactured by the method of claim 1, wherein the forming of the activation layer comprises:
    forming the first oxide semiconductor layer on the gate insulating layer in the first and second regions;
    patterning the first oxide semiconductor layer;
    forming the second oxide semiconductor layer in the first and second regions in which the first oxide semiconductor layer is included; and
    patterning the second semiconductor layer in the first and second regions.

9. An organic light emitting display device, comprising:
    a first thin film transistor disposed on a non-pixel region of a substrate, the first thin film transistor comprising a first activation layer formed by a first semiconductor layer and a second semiconductor layer which are disposed in immediate physical contact with each other, with the first oxide semiconductor layer having a different value of carrier concentration compared to that of the second oxide semiconductor layer;
    a second thin film transistor disposed on a pixel region of the substrate, the second thin film transistor having a second activation layer formed of one of the first and second oxide semiconductor layers.

10. The organic light emitting display device of claim 9, with the first oxide semiconductor layer having a higher value of the carrier concentration compared to that of the second oxide semiconductor layer.

11. The organic light emitting display device of claim 10, with the second activation layer being formed of the second oxide semiconductor layer.

12. An organic light emitting display device, comprising:
    a substrate that includes a first region and a second region;
    a first thin film transistor that comprises a gate electrode formed in the first region disposed on the substrate, an activation layer insulated from the gate electrode by a gate insulating layer and formed in a structure where a first semiconductor layer and a second semiconductor layer are sequentially stacked, and source and drain electrodes electrically and physically coupled to the activation layer, with the first oxide semiconductor layer having a higher carrier concentration compared to that of the second oxide semiconductor layer;

a second thin film transistor that comprises a gate electrode formed in the second region disposed on the substrate, an activation layer insulated from the gate electrode by a gate insulating layer and formed of the second oxide semiconductor layer, and source and drain electrodes electrically and physically coupled to the activation layer;

an insulating layer that is formed on the second thin film transistor and has a via hole in order that one of the source and drain electrodes of the second thin film transistor is exposed; and an organic light emitting diode that comprises a first electrode formed on the insulating layer disposed in the second region and the first electrode electrically coupled to one of the source and drain electrodes of the second thin film transistor through the via hole, an organic light emitting layer formed on the first electrode, and a second electrode formed on the organic light emitting layer.

13. The organic light emitting display device as claimed in claim 12, wherein the first region is a drive unit.

14. The organic light emitting display device as claimed in claim 12, wherein the first oxide semiconductor layer is formed between the second oxide semiconductor layer and the gate insulating layer.

15. The organic light emitting display device as claimed in claim 12, wherein the first oxide semiconductor layer is selected from a group consisting of ITO, InZnO, InSnO, AlZnO, AlGaO and InGaO.

16. The organic light emitting display device as claimed in claim 12, wherein the first oxide semiconductor layer is formed to be thinner than the second oxide semiconductor layer.

17. The organic light emitting display device as claimed in claim 16, wherein the first oxide semiconductor layer is formed with a thickness of 1 to 5 nm.

18. The organic light emitting display device as claimed in claim 12, wherein the second oxide semiconductor layer comprises zinc oxide (ZnO).

19. The organic light emitting display device as claimed in claim 18, wherein the second oxide semiconductor layer is doped with at least one ion selected from gallium (Ga), indium (In), stannum (Sn), zirconium (Zr), hafnium (Hf), cadmium (Cd), silver (Ag), copper (Cu), germanium (Ge), gadolinium (Gd), and vanadium (V).

20. The organic light emitting display device as claimed in claim 12, wherein the first oxide semiconductor layer has a carrier concentration of $1e+19\#/cm^3$ to $1e+21\#/cm^3$, and the second oxide semiconductor layer has a carrier concentration of $1e+13\#/cm^3$ to $1e+18\#/cm^3$.

* * * * *